(12) United States Patent
Frazier

(10) Patent No.: US 7,492,230 B2
(45) Date of Patent: Feb. 17, 2009

(54) METHOD AND APPARATUS FOR EFFECTING HIGH-FREQUENCY AMPLIFICATION OR OSCILLATION

(75) Inventor: Gary A. Frazier, Garland, TX (US)

(73) Assignee: Raytheon Company, Waltham, MA (US)

(*) Notice: Subject to any disclaimer, the term of this patent is extended or adjusted under 35 U.S.C. 154(b) by 351 days.

(21) Appl. No.: 11/375,530

(22) Filed: Mar. 14, 2006

(65) Prior Publication Data
US 2007/0057741 A1   Mar. 15, 2007

Related U.S. Application Data

(63) Continuation of application No. 10/748,566, filed on Dec. 30, 2003, now Pat. No. 7,012,475.

(51) Int. Cl.
    *H03B 5/12*      (2006.01)
(52) U.S. Cl. ............... 331/107 DP; 331/107 SL; 331/115; 331/108 C; 331/107 T
(58) Field of Classification Search ............ 331/115, 331/108 C, 107 SL, 107 DP, 107 T
    See application file for complete search history.

(56) References Cited

U.S. PATENT DOCUMENTS 3,967,210 A      6/1976  Aumann ................ 331/56
5,825,240 A  * 10/1998  Geis et al. ............. 327/570
5,920,231 A      7/1999  Ando .................... 330/61 R
6,303,941 B1   10/2001  Xie et al. ............... 257/25
6,348,887 B1    2/2002  Broekaert .............. 341/155
6,509,859 B1    1/2003  van der Wagt ......... 341/155

FOREIGN PATENT DOCUMENTS

EP    1240 188    7/1971

OTHER PUBLICATIONS

PCT, Notification of Transmittal of the International Search Report or the Declaration, dated May 19, 2005 for International Application No. PCT/US2004/043247, 12 pages.
Erik S. Daniel, "*Simulations of Electric Field Domain Suppression in a Superlattice Oscillator Device Using a Distributed Circuit Model,*" IEEE Transactions on Electron Devices, vol. 50, No. 12, Dec. 2003, pp. 2434-2444.
Richard H. Matthews, et al., "A New RTD-FET Logic Family," Proceedings of the IEEE, vol. 87, No. 4, Apr. 1999, pp. 596-605.

* cited by examiner

*Primary Examiner*—Arnold Kinkead
(74) *Attorney, Agent, or Firm*—Baker Botts L.L.P.

(57) ABSTRACT

An apparatus includes a distributed resonant tunneling section with a plurality of inductive portions that are coupled in series with each other between first and second nodes, such that a respective further node is present between each adjacent pair of the inductive portions. The distributed resonant tunneling section also has a plurality of resonant tunneling device portions which are each coupled between a third node and a respective one of the further nodes.

23 Claims, 4 Drawing Sheets

US 7,492,230 B2

METHOD AND APPARATUS FOR EFFECTING HIGH-FREQUENCY AMPLIFICATION OR OSCILLATION

CROSS REFERENCE TO RELATED APPLICATIONS

This application is a continuation of U.S. application Ser. No. 10/748,566, filed Dec. 30, 2003, and entitled "Method and Apparatus for Effecting High-Frequency Amplification or Oscillation," now U.S. Pat. No. 7,012,475.

TECHNICAL FIELD OF THE INVENTION

This invention relates in general to high-frequency circuits and, more particularly, to techniques for effecting high-frequency amplification or oscillation.

BACKGROUND OF THE INVENTION

A variety of amplifiers and oscillators exist for applications with operational frequencies below approximately 100 GHz. These include solid-state amplifiers and oscillators which are based on Gunn-effect diodes, impact avalanche transit time diodes, field effect transistors, and/or bipolar transistors. Other known approaches include vacuum sources such as klystrons, traveling wave tubes, and gyrotrons.

However, there are other types of systems in which there is a need for amplifiers and/or oscillators capable of operating at higher frequencies. For example, microwave systems need high-frequency amplifiers to improve the reception of signals, need high-frequency oscillators to serve as local oscillators in receiver circuits, and need high-frequency oscillators to serve as power oscillators in transmitter circuits. High-frequency amplifiers and oscillators for these applications have traditionally been implemented with large vacuum-tube devices, such as gyratrons, or with inefficient frequency-multiplied solid-state sources and parametric amplifiers. In this regard, frequency-multiplied solid-state sources translate an input signal at one frequency into a higher harmonic frequency, but at poor power conversion efficiency. Parametric amplifiers use driven, non-linear reactive elements to achieve power gain at high frequencies. While these existing approaches have been generally adequate for their intended purposes, they have not been satisfactory in all respects.

SUMMARY OF THE INVENTION

One form of the present invention relates to forming a distributed resonant tunneling section, and includes: coupling a plurality of inductive portions in series with each other between first and second nodes in a manner so that a respective further node is present between each adjacent pair of the inductive portions; and coupling each of a plurality of resonant tunneling device portions between a third node and a respective one of the further nodes.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
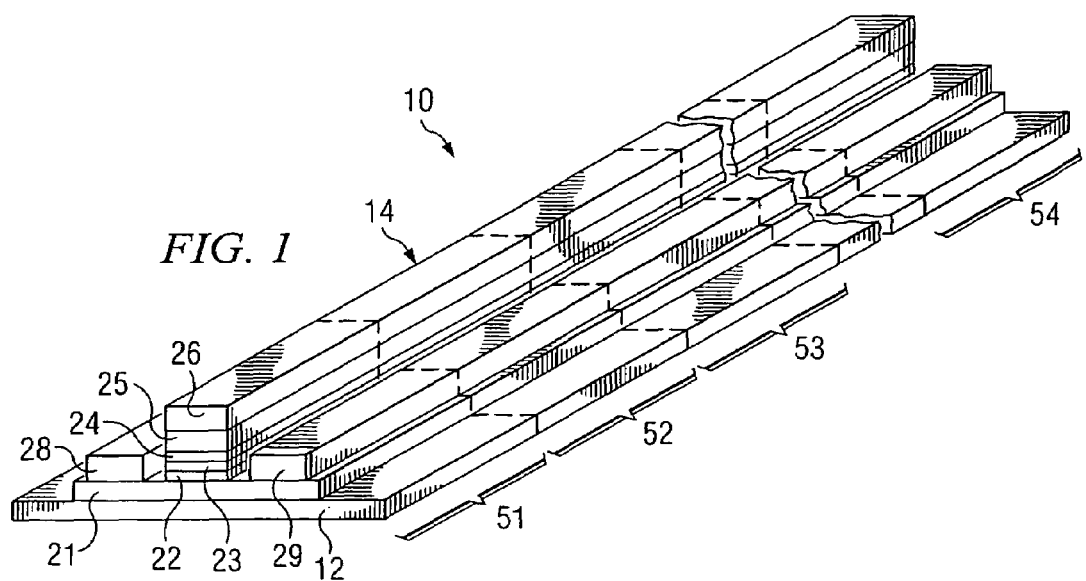
FIG. 1 is a diagrammatic perspective view of part of an apparatus which is an integrated circuit, and which embodies aspects of the present invention.
Figure 2:
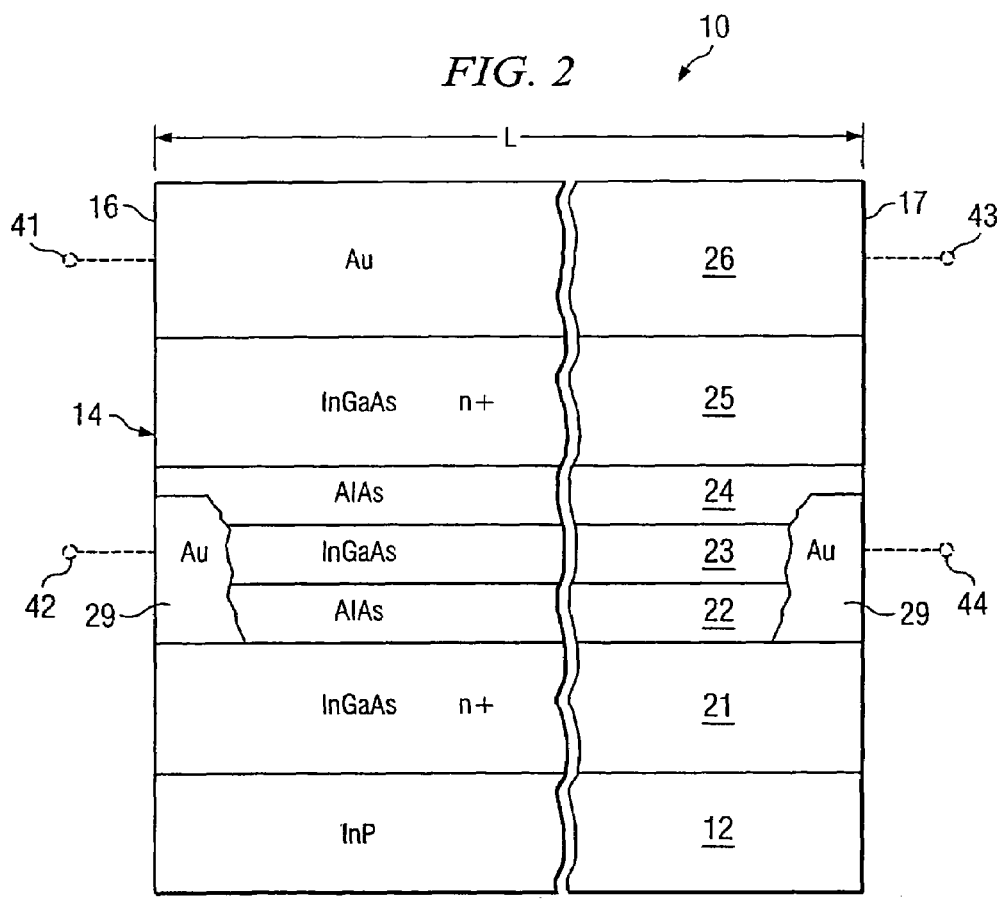
FIG. 2 is a diagrammatic fragmentary side view of the structure shown in FIG. 1.

FIG. 1 is a diagrammatic perspective view of part of an apparatus which is an integrated circuit 10, and which embodies aspects of the present invention. FIG. 2 is a diagrammatic fragmentary side view of the structure shown in FIG. 1. The integrated circuit 10 includes a substrate 12 which, in the disclosed embodiment, is made of indium phosphide (InP). It should be understood that the specific materials discussed herein for various parts of the integrated circuit 10 are exemplary, and the integrated circuit 10 could be implemented using other materials and/or other semiconductor technologies.

An elongate structure 14 is formed on top of the substrate 12 and, as shown in FIG. 2, has ends 16 and 17 which are at spaced locations. The distance between the ends 16 and 17 is the electrical length L of the structure 14. The structure 14 is referred to herein as a distributed resonant tunneling diode (DRTD) structure.

The DRTD structure 14 includes an electrically conductive layer 21, which is provided on the top surface of the substrate 12, and which extends from the end 16 to the end 17. In the disclosed embodiment, the conductive layer 21 is a doped semiconductor material, and in particular is indium gallium arsenide (InGaAs), which is doped to make it an n+ type semiconductor material.

The DRTD structure 14 also includes, on top of the layer 21, a stack of five further layers 22-26 which each extend from the end 16 to the end 17. In a transverse direction, the layers 22-26 are each substantially narrower than the layer 21, and are provided approximately in the center of the layer 21.

The layer 25 is an electrically conductive layer that is similar in thickness and composition to the layer 21. In particular, it is a doped semiconductor material. In the disclosed embodiment, it is indium gallium arsenide (InGaAs), which is highly doped in order to make it an n+ type semiconductor material. The center layer 23 is also made of InGaAs, but is not doped, or is only lightly doped. The layers 22 and 24 are each made of aluminum arsenide (AlAs), and are thus electrically insulating layers. In a vertical direction, the five layers 21-25 collectively define a resonant tunneling diode (RTD) structure.

The layer 26 is an electrical contact. The DRTD structure 14 includes two further electrical contacts 28 and 29, which are provided on top of the layer 21, and which each extend from the end 16 to the end 17 of the structure 14. The contacts 28 and 29 are provided on opposite sides of the stack that includes the layers 22-26, and are each spaced from this stack. In the disclosed embodiment, the contacts 26 and 28-29 are all made of gold. However, these contacts could alternatively made of any other suitable material which is electrically conductive. The contact 26 and the layer 25 effectively correspond to one conductor of a transmission line, and the contacts 28-29 and the layer 21 effectively correspond to the other conductor of the transmission line, with the RTD structure of the layers 21-25 disposed between these two conductors along the length thereof.

With reference to FIG. 2, broken lines are used to diagrammatically show how a terminal or node 41 of a circuit can be electrically coupled to the contact 26 of the DRTD structure 14 at the end 16 thereof, and to show how another terminal or node 42 of the circuit can be electrically coupled to each of the other contacts 28 and 29 at the end 16. FIG. 2 also shows how an additional terminal or node 43 can be coupled to the contact 26 at the end 17, and how a terminal or node 44 can be coupled to each of the contacts 28 and 29 at the end 17.

As indicated by broken lines in FIG. 1, the DRTD structure 14 of FIGS. 1 and 2 can be conceptually subdivided into a plurality of identical sections, several of which are identified by reference numerals 51-54. These sections are discussed later. The DRTD structure 14 is shown in FIG. 1 with an elongate configuration, in order to facilitate an understanding of the present invention. However, it would alternatively be possible for the DRTD structure to have other shapes.

Figure 3:
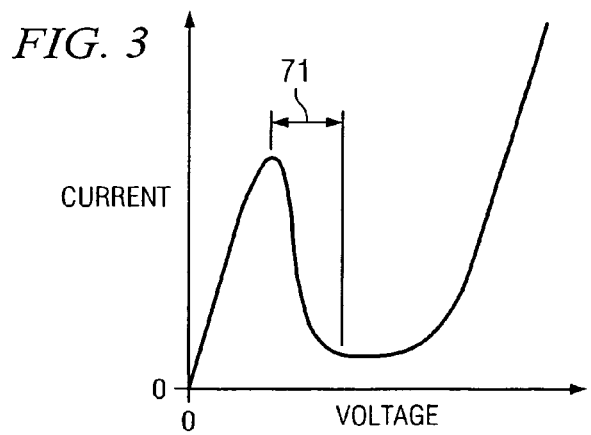
FIG. 3 is a graph depicting a curve showing how an electrical current within a resonant tunneling diode structure in the embodiment of FIG. 1 will vary in response to variation of a voltage applied across that structure.

As mentioned above, the layers 21-25 collectively form an RTD structure in a vertical direction. FIG. 3 is a graph depicting a curve that shows how an electrical current through this RTD structure will vary in response to variation of a voltage applied across the RTD structure, or in other words a voltage applied between the contact 26 and one or both of the contacts 28 and 29. It will be noted that the curve has a region 71 where the slope is negative. In effect, this represents a negative resistance characteristic of the RTD structure. As is known in the art, a positive resistance will absorb power, and thereby attenuate electrical signals. Conversely, a negative resistance such as that shown at 71 represents the opposite of attenuation, or in other words gain. A device with gain can be used to implement a circuit such as an oscillator or an amplifier.

Figure 4:
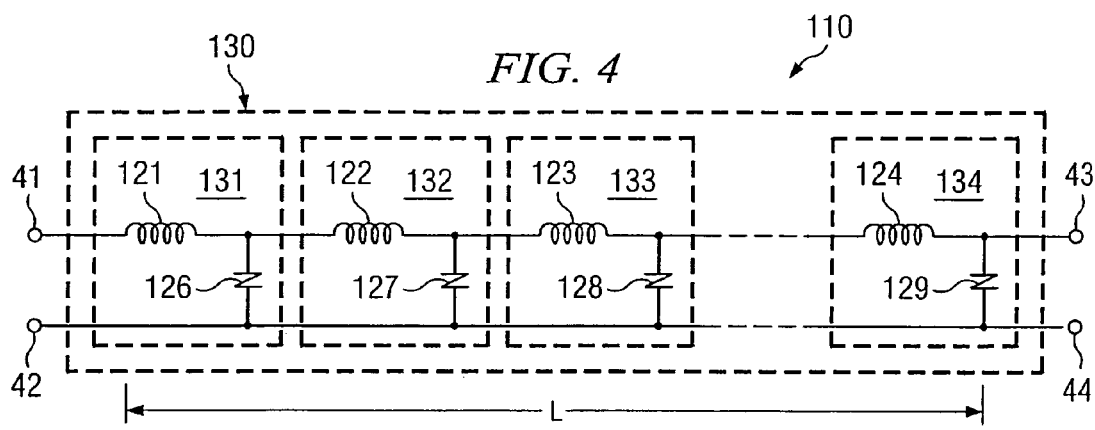
FIG. 4 is a circuit schematic showing an apparatus which is an alternative embodiment of the apparatus of FIG. 1.

FIG. 4 is a circuit schematic showing an apparatus 110 which is an alternative embodiment of the apparatus 10 of FIG. 1. Equivalent parts are identified by the same reference numerals. The apparatus 110 includes a plurality of discrete inductors coupled in series with each other between two terminals 41 and 43, four of which are shown at 121-124. This circuit also includes a plurality of discrete RTDs, four of which are shown at 126-129. Each of these RTDs has one end coupled to the right end of a respective inductor, and the other end coupled to a common conductive run which extends between two terminals 42 and 44. The inductors and the RTDs collectively form a distributed resonant tunneling diode (DRTD) structure 130, which is functionally comparable to the DRTD structure 14 in FIG. 1. The electrical path between the terminals 41 and 43 (including the inductors 121-124) effectively corresponds to one conductor of a transmission line, and the electrical path between the terminals 42 and 44 effectively corresponds to the other conductor of the transmission line. The RTDs, including those at 126-129, effectively extend between these transmission line conductors at spaced locations therealong.

The DRTD structure 130 in FIG. 4 can be conceptually divided into a plurality of identical sections, several of which are identified by reference numerals 131-134. These identical sections each include an inductor and an RTD. With reference to FIG. 1, the sections 51-54 of the DRTD structure 14 correspond conceptually to the sections 131-134 of the DRTD structure 130 in FIG. 4. In a sense, the circuitry within any one of the sections 131-134 in FIG. 4 represents a simplified equivalent circuit for the physical structure within any one of the sections 51-54 in FIG. 1.

In the DRTD structure 130 of FIG. 4, the inductors (including those at 121-124) can each be viewed as having an incremental coupling inductance $\Delta L$, and the RTDs (including those at 126-129) can each be viewed as having an incremental shunt capacitance $\Delta C$. With this in mind, the effective impedance $Z_{EFF}$ of the DRTD structure 130 will be roughly $Z_{EFF} = \sqrt{(\Delta L/\Delta C)}$.

Figure 5:
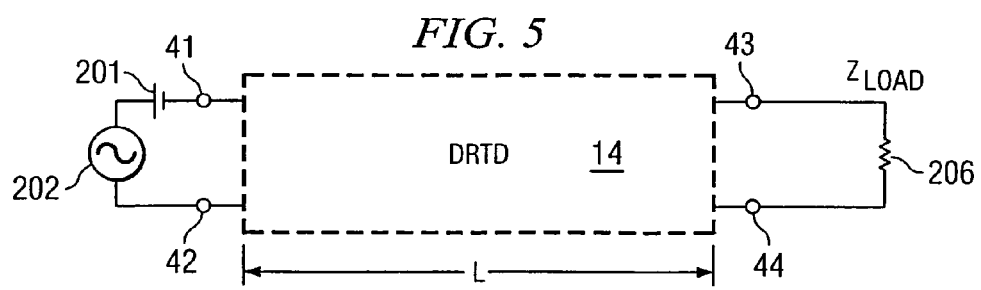
FIG. 5 is a diagrammatic view of a circuit in which a distributed resonant tunneling diode structure from the embodiment of FIG. 1 is used to effect amplification.

FIG. 5 is a diagrammatic view of a circuit in which the DRTD structure 14 of FIG. 1 is used to effect amplification. It would alternatively be possible to substitute the DRTD structure 130 of FIG. 4 for the DRTD structure 14 in the circuit of FIG. 5. FIG. 5 shows a direct current (DC) source 201 and an alternating current (AC) source 202, which are coupled in series with each other between the terminals 41 and 42. The DC source 201 is a low-impedance source such as a battery, which applies across the terminals 41-42 a DC bias voltage selected so that the RTD structure within the DRTD structure 14 is biased to operate in its negative resistance region (71 in FIG. 3). The AC source 202 is a low-impedance circuit which applies an AC input signal between the input terminals 41-42. As this AC signal travels from the input terminals 41-42 to the output terminals 43-44, it is amplified by the DRTD structure 14.

A load 206 is coupled between the output terminals 43-44. The load 206 has an impedance $Z_{LOAD}$ which is matched to the effective impedance $Z_{EFF}$ exhibited by the DRTD structure 14 when viewed from the output terminals 43 and 44. For the purpose of effecting amplification, the electrical length L (FIG. 2) of the DRTD structure 14 can be selected to be any convenient length, so long as no reflections occur that could produce oscillatory feedback. The circuitry coupled to the terminals 41-44 which is external to the DRTD structure 14 could be an integral part of the integrated circuit 10 (FIG. 1). Alternatively, it could be implemented with discrete components that are external to the integrated circuit.

Figure 6:
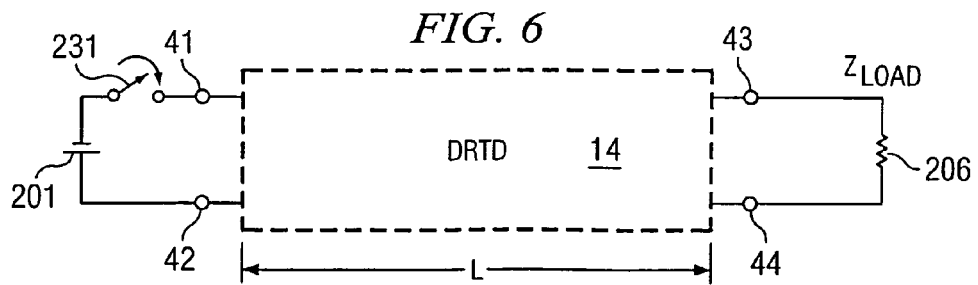
FIG. 6 is a diagrammatic view of a circuit in which the distributed resonant tunneling diode structure from the embodiment of FIG. 1 is used to effect oscillation.

FIG. 6 is a diagrammatic view of a circuit in which the DRTD structure 14 is used to effect oscillation. The DRTD structure 130 of FIG. 4 could be substituted for the DRTD structure 14 in the circuit of FIG. 6. In FIG. 6, a DC source 201 is coupled in series with a switch 231 between the terminals 41 and 42. The switch 231 is an electronic switch of a known type. The switch 231 is closed in order to start operation of the oscillator circuit, and then remains continuously closed.

In FIG. 6, the DRTD structure 14 has an electrical length L, which is the physical length of the structure 14 times the apparent dielectric constant of the composite structure 14. For example, if the apparent dielectric constant of the structure 14 as seen by electromagnetic waves traveling through the structure 14 is 3.3, then the physical length of the structure 14 is (L/3.3). The electrical length of the DRTD structure 14 is selected to be an integer multiple of one-quarter wavelength of the selected frequency at which oscillation is to occur. This permits a standing wave to develop and to be maintained within the DRTD structure 14. In the embodiment disclosed in FIG. 6, the electrical length L is selected to be one-half of a wavelength of the frequency of interest, in order to optimize boundary conditions and prevent oscillation at lower frequencies.

In more detail, in order to support oscillation, the external circuitry attached to each end of the structure 14 needs to have an impedance which is different from the apparent terminal impedance of the structure 14. These impedance discontinuities at the ends of the structure 14 cause reflections of traveling electromagnetic waves within the structure 14, and the standing wave created by these reflections is amplified within the structure 14 so as to overcome losses and sustain oscillation. The relation of the impedance of the structure 14 to these end impedances determines the selected length of the structure 14.

In particular, if the circuits at each end of the structure 14 have impedances which are both less than or both greater than the impedance of the structure 14, then the electrical length of the structure 14 is selected to be an integer number of one-half wavelengths of the selected frequency. In contrast, if the circuit at one end of the structure 14 has an impedance which is less than the impedance of structure 14, and the circuit at the other end of the structure 14 has an impedance which is greater than the impedance of the structure 14, then the electrical length of the structure 14 is selected to be an integer number of quarter wavelengths of the selected frequency.

In FIG. 6, the load 206 has an impedance $Z_{LOAD}$ which is selected to create a termination mismatch with respect to the effective impedance $Z_{EFF}$ exhibited by the DRTD structure 14 at the terminals 43 and 44. The mismatch may be reactive or resistive, or a combination of both. As discussed above, this termination mismatch is needed in order to provide reflections at the load 206 which are suitable for sustaining standing wave oscillation within the DRTD structure 14.

Figure 7:
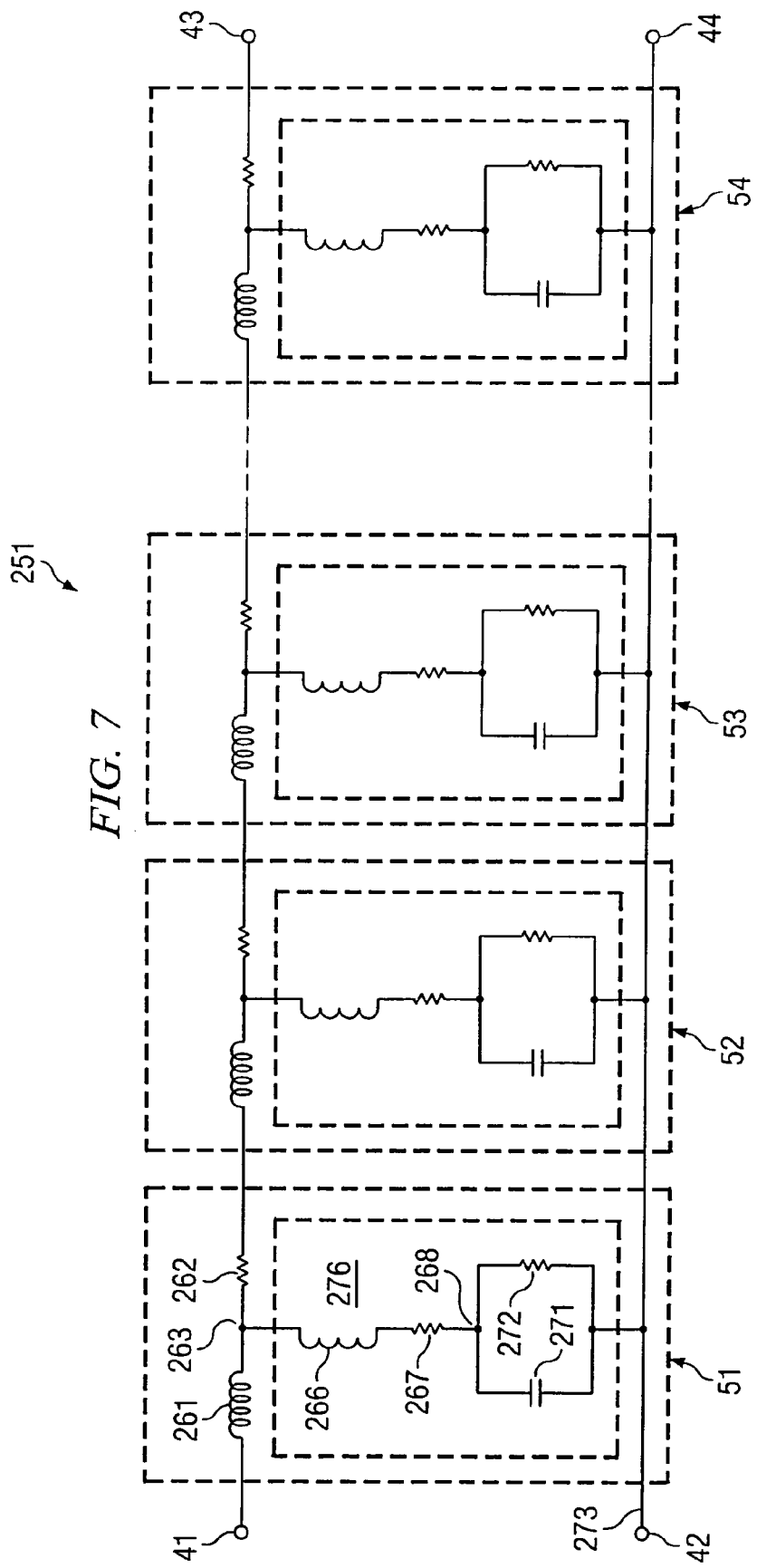
FIG. 7 is a schematic diagram of a circuit 251, which is an equivalent circuit for the distributed resonant tunneling diode structure from the embodiment of FIG. 1.

FIG. 7 is a schematic diagram of a circuit 251, which is an equivalent circuit for the DRTD structure 14 shown in FIG. 1. The circuit 251 has a plurality of identical sections which are coupled in series with each other, and four of these sections are identified by reference numerals 51-54. These sections 51-54 of the circuit 251 are each an equivalent circuit for the respective corresponding section 51-54 in the DRTD structure 14 in FIG. 1. Since the sections of the circuit 251 are identical, only the circuitry within the section 51 is described below in detail.

More specifically, the section 51 includes an inductor 261 and a resistor 262, which are coupled in series with each other, and a circuit node 263 is present between them. An inductor 266 and a resistor 267 are coupled in series with each other between the node 263 and a further node 268. A capacitor 271 and a resistor 272 are coupled in parallel with each other between the node 268 and a common line 273. The section 51 has a portion 276, which includes the inductor 266, the resistor 267, the capacitor 271 and the resistor 272. The portion 276 corresponds to the RTD structure in the section 51 of the structure 14 in FIGS. 1-2, or in other words the layers 21-25. The inductor 261 and the resistor 262 represent inductive and resistive components of transmission line characteristics that are inherent to the section 51 of the structure 14 in FIG. 1.

Figure 8:
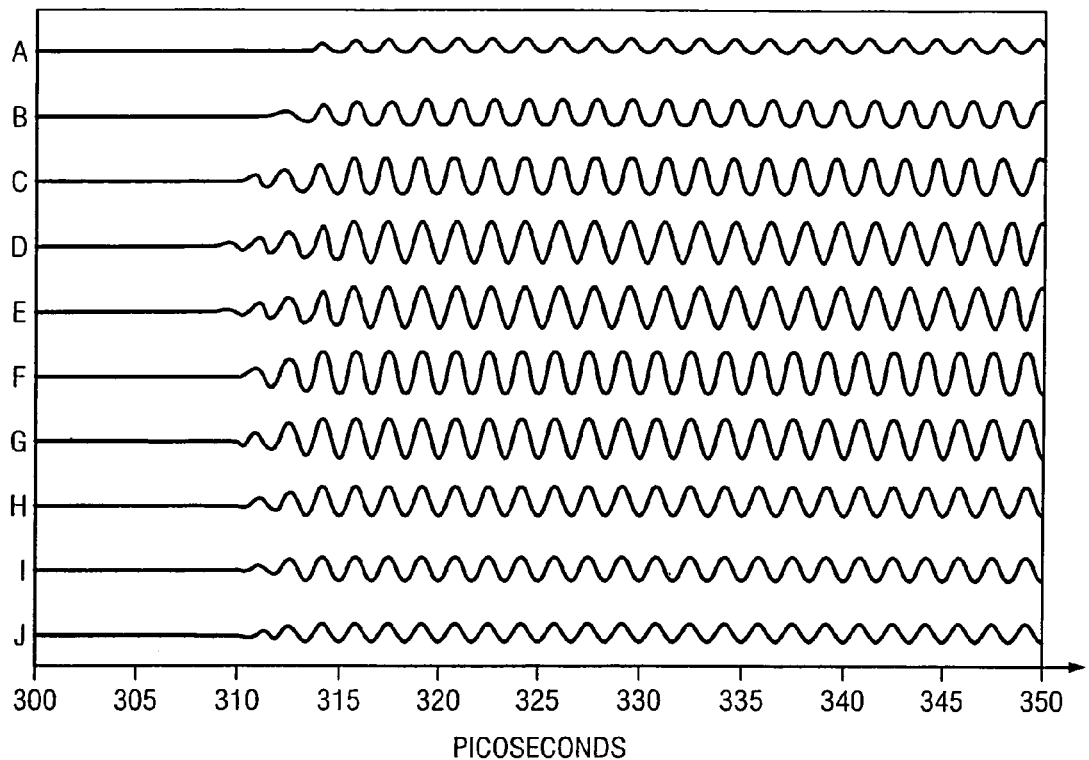
FIG. 8 is graph showing the result of a computer simulation of the operation of the circuit shown in FIG. 6.

A computer simulation was carried out for the oscillator circuit of FIG. 6, using the equivalent circuit 251 of FIG. 7 to model the DRTD structure 14. The frequency of oscillation for the simulation was selected to be 580 GHz, and thus the electrical length L of the DRTD structure 14 was selected to be one-half of the wavelength of a 580 GHz signal. The equivalent circuit was configured so that the RTD portion 276 in each of the sections 51-54 was representative of a 120 kA/cm² RTD. The speed index of such an RTD relates the large-signal switching of the RTD to its internal characteristics, and is about 240 GHz. But in the negative resistance region, the gain-bandwidth product of the RTD can be significantly greater than its speed index. The simulation was configured so that the output of the oscillator would be 54 microwatts into a purely resistive load of 20 ohms. For the simulation, the equivalent circuit 251 was configured to give the RTD 14 an effective impedance $Z_{EFF}$ of about 50 ohms. The DC source 201 of FIG. 6 was configured to have an impedance of approximately zero ohms for the simulation. In the simulation, the switch 231 (FIG. 6) was closed at a time T=0, and FIG. 8 is graph showing the result of the simulation over time at ten different points A-J which were distributed uniformly along the electrical length L of the DRTD structure 14.

Figure 9:
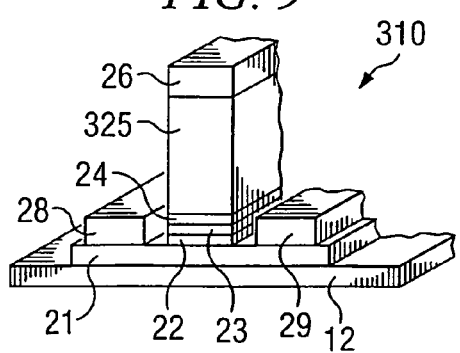
FIG. 9 is a diagrammatic fragmentary perspective view showing an apparatus in the form of an integrated circuit, which is an alternative embodiment of the integrated circuit of FIG. 1.

FIG. 9 is a diagrammatic fragmentary perspective view showing an apparatus in the form of an integrated circuit 310, which is an alternative embodiment of the integrated circuit 10 of FIG. 1. Equivalent parts are identified by the same reference numerals, and the following discussion focuses on the differences.

In particular, the only significant difference between the integrated circuits 10 and 310 is that the layer 25 in the integrated circuit 10 of FIG. 1 has been replaced with a different layer 325 in the integrated circuit 310 of FIG. 9. The layer 325 is substantially thicker than the layer 25, and is not heavily doped. Instead, the layer 325 is a lightly doped layer of indium gallium arsenide (InGaAs) which, in the disclosed embodiment, has a level of doping that is about the same as that used for the layer 23. The increased thickness of the layer 25 serves to increase the effective distance between the electrically conductive contact 26 and the electrically conductive layer 21.

To the extent that the contact 26 and the layer 21 are comparable to the conductors of a transmission line, the increased thickness of the layer 325 increases the gap between them, which in turn reduces the effective capacitance between them. This allows the structure shown in FIG. 9 to be used at lower operational frequencies than the structure of FIG. 1, and with lower transmission losses. In addition, by reducing the capacitance of the amplifying medium, the losses and bandwidth of the circuit at high operating frequencies will improve. The reduced capacitance also raises the impedance of the multi-layer structure of FIG. 9, which makes it easier to match the impedance of this structure to external circuits or loads, such as an antenna.

Due to the fact that the layer 325 is not heavily doped, the embodiment of FIG. 9 does not have ohmic contact between the contact 26 and the layer 325. Instead, a Schottky diode structure is effectively formed between the contact 26 and the layer 325. One consideration resulting from this Schottky diode structure is that polarity becomes a factor, for example when coupling a DC source such as a battery to the structure of FIG. 9. In contrast, the structure shown in FIG. 1 is electrically symmetric, and does not present an issue of polarity.

The present invention provides a number of advantages. One such advantage results from the provision of structure which can be used to implement circuits such amplifiers or oscillators that operate at very high frequencies, for example up to about 1,000 GHz. Further, by combining several RTD devices, or by using an elongate RTD structure, increased power-handling capability can be obtained, and can be tailored to meet the needs of a particular application. Examples of applications include generation of coherent signals for receiver down-conversion, and power sources for transmitters. In addition, properly terminated, the disclosed structure can provide low-noise amplification for use in the front end of a receiver circuit.

Although selected embodiments have been illustrated and described in detail, it will be understood that various substitutions and alterations are possible without departing from the spirit and scope of the present invention, as defined by the following claims.

What is claimed is:

1. An apparatus comprising a distributed resonant tunneling section which includes:
   a plurality of inductive portions coupled in series with each other between first and second nodes, such that a respective further node is present between each adjacent pair of said inductive portions; and
   a plurality of resonant tunneling device portions, each said resonant tunneling device portion being coupled between a third node and a respective said further node, wherein each respective said further node is free from electrical contact with a resonant tunneling device other than any resonant tunneling device coupled between the third node and said respective further node.

2. An apparatus according to claim 1,
   wherein said inductive portions each include a respective discrete inductor; and
   wherein said resonant tunneling device portions each include a respective discrete resonant tunneling diode.

3. An apparatus according to claim 1, comprising an integrated circuit which includes said first and second nodes at respective spaced first and second locations, and which includes first and second sections that each extend from a region of said first location to a region of said second location, said first section including a plurality of different portions which each include a respective said inductive portion, and said second section including a plurality of different portions which each include a respective said resonant tunneling device portion.

4. An apparatus according to claim 3, wherein said second section includes a plurality of layers which each extend from the region of said first location to the region of said second location, and which each include a plurality of portions that are each part of a respective said resonant tunneling device portion.

5. An apparatus according to claim 4, wherein said layers of said second section include at least one electrically conductive layer coupling at least two physically separate contacts, said separate contacts extend from the region of said first location to the region of said second location.

6. An apparatus according to claim 4, wherein said layers of said second section include, in sequence, first, second, third, fourth and fifth layers, said third and fifth layers being a lightly doped semiconductor material, said second and fourth layers each being an insulating material, and said first layer being a highly doped semiconductor material which is electrically conductive, said fifth layer being thicker than any of said first, second, third and fourth layers.

7. An apparatus according to claim 6, including first and second electrically conductive contacts which each extend from the region of said first location to the region of said second location, said first contact being provided on a surface of said fifth layer spaced from said fourth layer, and said second contact being provided on a surface of said first layer spaced from said second layer.

8. An apparatus according to claim 6, including first and second electrically conductive contacts which each extend from the region of said first location to the region of said second location, said first contact being provided on a surface of said fifth layer spaced from said fourth layer, and said second contact being provided on a surface of said first layer spaced from said second layer.

9. An apparatus according to claim 4, wherein said second section is elongate in a direction extending between said first and second locations.

10. An apparatus according to claim 4, wherein said first section includes a layer which has a plurality of portions that are each part of a respective said inductive portion.

11. An apparatus according to claim 1, including a bias section which effects biasing of each of said resonant tunneling device portions for operation in a mode in which said resonant tunneling device portions each exhibit a negative resistance.

12. An apparatus according to claim 11, including circuitry coupled to said first, second and third nodes of said distributed resonant tunneling section, said distributed resonant tunneling section effecting amplification, as a function of gain derived from said negative resistance of said resonant tunneling device, of a signal applied between said first and third nodes by said circuitry.

13. An apparatus according to claim 12, wherein said circuitry includes a load which is coupled between said second and third nodes, said load having an impedance that is substantially matched to an effective impedance of said distributed resonant tunneling section and a low impedance source coupled between said first and third nodes.

14. An apparatus according to claim 11,
   wherein a distance between said first and second locations is approximately an integer multiple of one-fourth of a wavelength of a selected frequency; and
   including circuitry coupled to said first, second and third nodes of said distributed resonant tunneling section, said distributed resonant tunneling section oscillating at said selected frequency as a function of gain derived from said negative resistance of said resonant tunneling device.

15. An apparatus according to claim 14, wherein said circuitry includes:
   a power source which is coupled between said first and third nodes; and
   a load which is coupled between said second and third nodes, said load having an impedance which is substantially different from an effective impedance of said distributed resonant tunneling section.

16. A method of forming a distributed resonant tunneling section, comprising:
   coupling a plurality of inductive portions in series with each other between first and second nodes in a manner so that a respective further node is present between each adjacent pair of said inductive portions; and
   coupling each of a plurality of resonant tunneling device portions between a third node and a respective said further node, such that each respective said further node is free of resonant tunneling device portions other than said resonant tunneling device portion being coupled between said third node and said respective further node.

17. A method according to claim 16, including:
   configuring said inductive portions so that they each include a respective discrete inductor; and
   configuring said resonant tunneling device portions so that they each include a respective discrete resonant tunneling diode.

18. A method according to claim 16, including:
   providing an integrated circuit which includes said first and second nodes at respective spaced first and second locations, and which includes first and second sections that each extend from a region of said first location to a region of said second location;
   configuring said first section to have a plurality of different portions which each include a respective said inductive portion; and configuring said second section to have a plurality of different portions which each include a respective said resonant tunneling device portion.

19. A method according to claim 18, wherein said configuring of said second section includes configuring said second section to have a plurality of layers which each extend from the region of said first location to the region of said second location, and which each include a plurality of portions that are each part of a respective said resonant tunneling device portion.

20. A method according to claim 19, wherein said configuring of said first section includes configuring said first section to have a layer which has a plurality of portions that are each part of a respective said inductive portion.

21. A method according to claim 16, including biasing each of said resonant tunneling device portions for operation in a mode in which said resonant tunneling device portions each exhibit a negative resistance.

22. A method according to claim 21, including causing said distributed resonant tunneling section to effect amplification, as a function of gain derived from said negative resistance of said resonant tunneling device, of a signal applied between said first and third nodes.

23. A method according to claim 21, including:

selecting a distance between said first and second locations to be approximately an integer multiple of one-fourth of a wavelength of a selected frequency; and causing said distributed resonant tunneling section to oscillate at said selected frequency as a function of gain derived from said negative resistance of said resonant tunneling device.

* * * * *